United States Patent
Tsai et al.

(10) Patent No.: US 10,062,766 B1
(45) Date of Patent: Aug. 28, 2018

(54) HETERO-JUNCTION SCHOTTKY DIODE DEVICE

(71) Applicant: Nuvoton Technology Corporation, Hsinchu (TW)

(72) Inventors: Jung-Tse Tsai, Hsinchu (TW); Heng-Kuang Lin, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/866,492

(22) Filed: Jan. 10, 2018

(30) Foreign Application Priority Data

Jul. 26, 2017 (TW) .............................. 106125036 A

(51) Int. Cl.
| | | |
|---|---|---|
| H01L 29/00 | (2006.01) | |
| H01L 29/66 | (2006.01) | |
| H01L 29/20 | (2006.01) | |
| H01L 29/06 | (2006.01) | |
| H01L 21/768 | (2006.01) | |
| H01L 21/02 | (2006.01) | |
| H01L 29/872 | (2006.01) | |

(52) U.S. Cl.
CPC ...... *H01L 29/66212* (2013.01); *H01L 21/022* (2013.01); *H01L 21/76805* (2013.01); *H01L 29/0684* (2013.01); *H01L 29/2003* (2013.01); *H01L 29/66143* (2013.01); *H01L 29/872* (2013.01); *H01L 2924/12032* (2013.01)

(58) Field of Classification Search
CPC ............. H01L 29/872; H01L 29/66143; H01L 29/66212; H01L 2924/12032
See application file for complete search history.

(56) References Cited

U.S. PATENT DOCUMENTS

| | | | | |
|---|---|---|---|---|
| 4,646,115 A | * | 2/1987 | Shannon | ............. H01L 29/0619 257/484 |
| 6,768,146 B2 | | 7/2004 | Yoshida | |
| 9,818,886 B2 | * | 11/2017 | Aketa | ................... H01L 29/872 |

(Continued)

FOREIGN PATENT DOCUMENTS

| | | |
|---|---|---|
| CN | 103026491 | 4/2013 |
| TW | 201138107 | 11/2011 |

(Continued)

OTHER PUBLICATIONS

Jun Ma, et al., "High-Voltage and Low-Leakage AlGaN/GaN Tri-Anode Schottky Diodes With Integrated Tri-Gate Transistors," IEEE Electron Device Letters, vol. 38, No. 1, Jan. 2017, pp. 83-86.

(Continued)

*Primary Examiner* — Ngan Ngo
(74) *Attorney, Agent, or Firm* — JCIPRNET

(57) ABSTRACT

A hetero-junction Schottky diode device includes a buffer layer, at least one channel layer, at least one barrier layer and a Schottky metal layer. The buffer layer is disposed on a substrate. The at least one channel layer is disposed on the buffer layer. The at least one barrier layer is disposed on the at least one channel layer. Besides, multiple strip openings are configured to penetrate through the at least one barrier layer and at least one channel layer. The Schottky metal layer is disposed on the at least one barrier layer, across the strip openings and fills in the strip openings.

18 Claims, 9 Drawing Sheets

(56) References Cited

U.S. PATENT DOCUMENTS

| | | | |
|---|---|---|---|
| 2003/0062525 A1 | 4/2003 | Parikh et al. | |
| 2007/0284653 A1* | 12/2007 | Ueno | H01L 29/1066 257/324 |
| 2008/0054304 A1 | 3/2008 | Sadaka et al. | |
| 2013/0075822 A1* | 3/2013 | Ho | H01L 29/7784 257/368 |
| 2014/0084346 A1* | 3/2014 | Tajiri | H01L 29/2003 257/194 |
| 2014/0097433 A1* | 4/2014 | Negoro | H01L 29/66462 257/51 |
| 2014/0110759 A1* | 4/2014 | Murata | H01L 29/7783 257/194 |
| 2016/0329421 A1* | 11/2016 | Shibata | H01L 29/861 |
| 2016/0380119 A1* | 12/2016 | Jung | H01L 29/872 257/76 |
| 2017/0098719 A1* | 4/2017 | Chen | H01L 29/872 |
| 2017/0263701 A1* | 9/2017 | Oka | H01L 29/0638 |

FOREIGN PATENT DOCUMENTS

| | | |
|---|---|---|
| WO | 2012008074 | 1/2012 |
| WO | 2015040682 | 3/2015 |

OTHER PUBLICATIONS

Yi-Wei Lian, et al., "AlGaN/GaN Schottky Barrier Diodes on Silicon Substrates With Selective Si Diffusion for Low Onset Voltage and High Reverse Blocking," IEEE Electron Device Letters vol. 34, No. 8, Aug. 2013, pp. 981-983.

"Office Action of Taiwan Counterpart Application," dated Mar. 27, 2018, p. 1-p. 7.

\* cited by examiner

HETERO-JUNCTION SCHOTTKY DIODE DEVICE

CROSS-REFERENCE TO RELATED APPLICATION

This application claims the priority benefit of Taiwan application no. 106125036, filed on Jul. 26, 2017. The entirety of the above-mentioned patent application is hereby incorporated by reference herein and made a part of this specification.

BACKGROUND OF THE INVENTION

Field of the Invention

The invention is related to a semiconductor device, and particularly to a hetero-junction Schottky diode device.

Description of Related Art

In recent years, III-V compound semiconductor based high electron mobility transistor (HEMT) devices have been widely applied in high power electronic devices due to their high breakdown voltage and fast switch speed, etc.

Generally speaking, in a GaN-based hetero-junction Schottky diode, a two-dimensional electronic gas (2DEG) channel has high electron density and high mobility rate and is characterized with high-voltage resistance. In terms of application in switch of high power, low switch consumption can be realized. However, this type of hetero junction Schottky diode is generally found to have the problem of high threshold voltage and high transmission resistance.

SUMMARY OF THE INVENTION

Accordingly, the invention provides a hetero-junction Schottky diode device which is capable of realizing low switch consumption, low threshold voltage and low transmission resistance.

The invention provides a hetero-junction Schottky diode device, including a buffer layer, at least one channel layer, at least one barrier layer and a Schottky metal layer. The buffer layer is disposed on a substrate. At least one channel layer is disposed on the buffer layer. At least one barrier layer is disposed on the at least one channel layer. In addition, a plurality of strip openings is disposed to penetrate through the at least one barrier layer and the at least one channel layer. The Schottky metal layer is disposed on the at least one barrier layer, across the strip openings and fills in the strip openings.

In an embodiment of the invention, the strip openings extend along a first direction, and the Schottky metal layer extends along a second direction; the second direction is different from the first direction.

In an embodiment of the invention, an end portion of the strip openings is unaligned with an edge of the Schottky metal layer.

In an embodiment of the invention, the end portion of the strip openings is aligned with the edge of the Schottky metal layer.

In an embodiment of the invention, the hetero junction Schottky diode device further includes an ohmic metal layer disposed on the barrier layer and spaced apart from the Schottky metal layer by a distance.

In an embodiment of the invention, the strip openings extend along the first direction, and the ohmic metal layer extends along the second direction; the second direction is different from the first direction.

In an embodiment of the invention, the ohmic metal layer is not in contact with the strip openings.

In an embodiment of the invention, the ohmic metal layer is disposed across the strip openings and fills in the strip openings.

In an embodiment of the invention, each of the strip openings has an inclined sidewall.

In an embodiment of the invention, the strip openings are in a linear shape, a saw-tooth shape, a wave-like shape, or a fish-bone shape.

In an embodiment of the invention, the sidewall of the strip openings is substantially smooth.

In an embodiment of the invention, the sidewall of the strip openings is rough.

In an embodiment of the invention, at least one recess is disposed to penetrate through the at least one barrier layer and extends into a portion of the at least one channel layer, and the at least one recess is disposed between two of the adjacent strip openings.

In an embodiment of the invention, the at least one recess has an inclined sidewall.

In an embodiment of the invention, a bottom portion of the at least one recess is lower than two-dimensional electronic gas (2DEG), and the Schottky metal layer fills in the at least one recess.

In an embodiment of the invention, the at least one channel layer includes a plurality of channel layers. The at least one barrier layer includes a plurality of barrier layers. The plurality of channel layers and the plurality of barrier layers are disposed alternately.

In an embodiment of the invention, the hetero junction Schottky diode device further includes a silicon-containing doped layer disposed on the at least one barrier layer and in contact with the Schottky metal layer.

In an embodiment of the invention, a doping concentration of the silicon-containing doped layer is about $5 \times 10^{14}$ to about $5 \times 10^{19}$ atom/cm$^3$.

In an embodiment of the invention, the hetero-junction Schottky diode device further includes an anode metal layer and a cathode metal layer disposed on both sides of the Schottky metal layer. An extending direction of the anode metal layer and the cathode metal layer is the same as an extending direction of the Schottky metal layer.

In an embodiment of the invention, the hetero junction Schottky diode device further includes the anode metal layer and the cathode metal layer disposed on both sides of the Schottky metal layer. The extending direction of the anode metal layer and the cathode metal layer is different from the extending direction of the Schottky metal layer.

In summary, the hetero-junction Schottky diode device of the invention is a three-dimensional structure which can increase a contact area between the Schottky metal layer and the 2DEG so as to decrease transmission resistance and reduce threshold voltage.

In order to make the aforementioned features and advantages of the invention more comprehensible, embodiments accompanying figures are described in detail below.

DESCRIPTION OF EMBODIMENTS

The invention provides various types of hetero-junction Schottky diode devices which applies a technical means of disposing a plurality of strip openings and filling the Schottky metal layer in the strip openings to increase a contact area between a Schottky metal layer and a two-dimensional electronic gas (2DEG) so as to reduce transmission resistance and lower threshold voltage.

Figure 8:
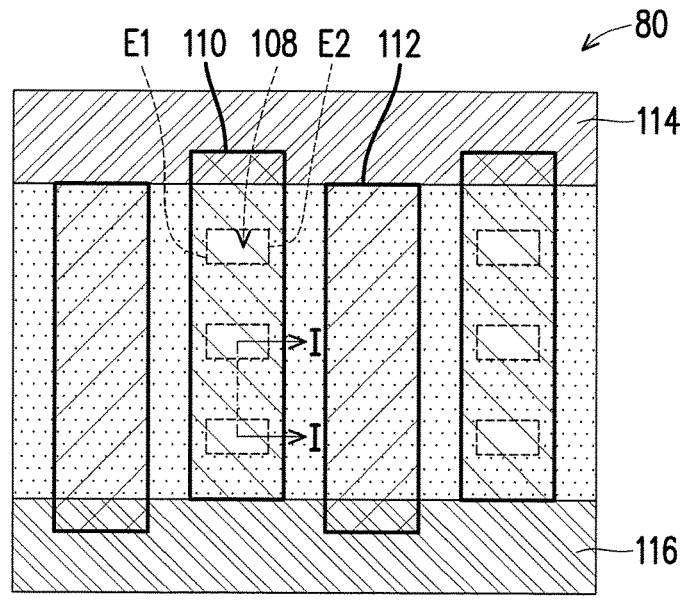
Figure 9:
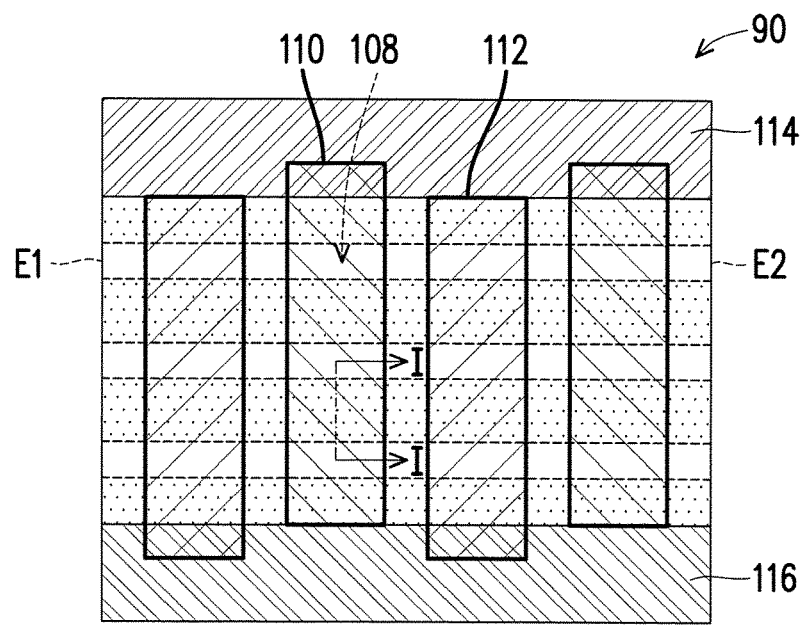
Figure 10:
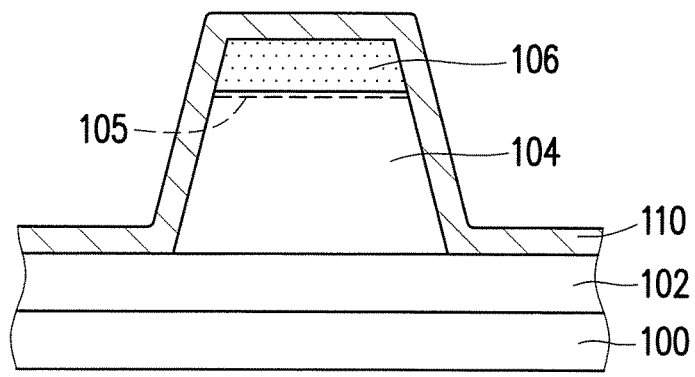
FIG. 10 and FIG. 11 are cross-sectional views of FIG. 1 to FIG. 9 taken along line I-I.
Figure 11:
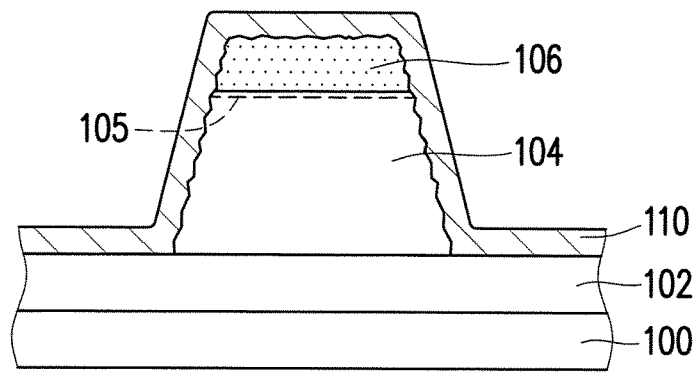

FIG. 1 to FIG. 9 are schematic top views illustrating various types of hetero-junction Schottky diode devices according to some embodiment of the invention. FIG. 10 and FIG. 11 are cross-sectional views of FIG. 1 to FIG. 9 taken along line I-I.

Referring to FIG. 1 to FIG. 11, hetero-junction Schottky diode devices 10/20/30/40/50/60/70/80/90 of the invention include a substrate 100, a buffer layer 102, at least one channel layer 104, at least one barrier layer 106, a Schottky metal layer 110 and an ohmic metal layer 112.

The channel layer 104 is disposed on the substrate 100. In one embodiment, the material of the substrate 100 includes sapphire, Si, SiC or GaN. In one embodiment, the material of the channel layer 104 includes a group-III nitride such as a III-V group compound semiconductor material. In one embodiment, the material of the channel layer 104 includes GaN. In addition, the channel layer 104 may be a doped or an undoped layer. In one embodiment, the channel layer 104 includes a 2DEG 105 disposed under a boundary between the channel layer 104 and the barrier layer 106 disposed thereon.

The buffer layer 102 may be disposed between the substrate 100 and the channel layer 104 for reducing the lattice constant difference and the difference in thermal expansion coefficient between the substrate 100 and the channel layer 104. In one embodiment, the material of the buffer layer 102 includes a group-III nitride such as a III-V group compound semiconductor material, and may have a single-layered or multi-layered structure. In one embodiment, the material of the buffer layer includes AlN, GaN, AlGaN, InGaN, AlInN, AlGaInN or a combination thereof.

Referring to FIG. 10 and FIG. 11, the barrier layer 106 is disposed on the channel layer 104. In one embodiment, the material of the barrier layer 106 includes a group-III nitride such as a III-V compound semiconductor material, and may have a single-layered or multi-layered structure. In one embodiment, the barrier layer 106 includes AlGaN, AlInN, AlN or AlGaInN or a combination thereof. In one embodiment, the barrier layer 106 may be a doped or an undoped layer.

In the invention, the plurality of strip openings 108 are disposed to penetrate through the barrier layer 106 and the channel layer 104, and a portion of the buffer layer 102 is exposed from the strip openings 108; however, the invention is not limited thereto. The strip openings 108 may be disposed on the buffer layer 102 without being exposed from the buffer layer 102. In addition, the Schottky metal layer 110 is disposed on the barrier layer 106, across the strip openings 108 and fills in the strip openings 108. In this manner, the contact area between the Schottky metal layer 110 and the 2DEG 105 can be increased so as to reduce transmission resistance and threshold voltage. In one embodiment, the material of the Schottky metal layer 110 includes (for example, but not limited to) titanium nitride, nickel or other material that can form Schottky contact with the III-V group compound semiconductor.

The possible configuration relationship between the strip openings 108 and the Schottky metal layer 110 is described as follows, but the invention is not limited thereto.

Figure 6:
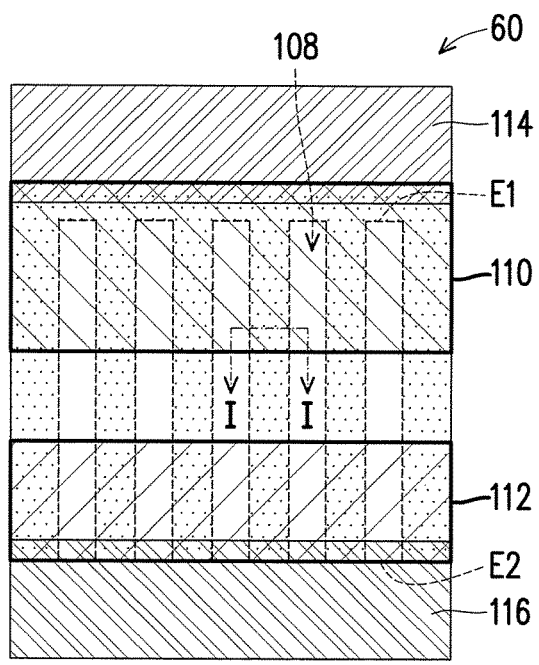
Figure 7:
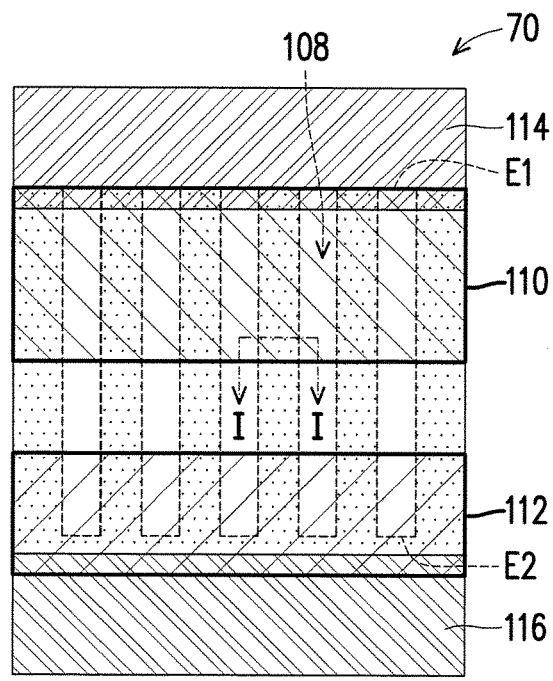

In one embodiment, the strip openings 108 extend along a first direction, and the Schottky metal layer 110 extends along a second direction; the second direction is different from the first direction. In the embodiments of FIG. 1 through FIG. 7, the strip openings 108 extend along a Y-direction, and the Schottky metal layer 110 extends along an X-direction. However, the invention is not limited thereto. In the embodiments of FIG. 8 to FIG. 9, the strip openings 108 extend along the X-direction, and the Schottky metal layer 110 extends along the Y-direction.

In one embodiment, the strip openings 108 have an inclined side all which can further increase the contact area between the Schottky metal layer 110 and the 2DEG 105 as shown in FIG. 10 and FIG. 11. More specifically, an included angle between the sidewall and a bottom surface of the strip openings is larger than 90 degrees and smaller than 150 degrees; however, the invention is not limited thereto. In another embodiment, the strip openings 108 have a substantially vertical sidewall. In one embodiment, the sidewall of the strip openings is substantially smooth as shown in FIG. 10. In another embodiment, the sidewall of the strip openings 108 is rough which can further increase the contact area between the Schottky metal layer 110 and the 2DEG 105 as shown in FIG. 11.

Figure 1:
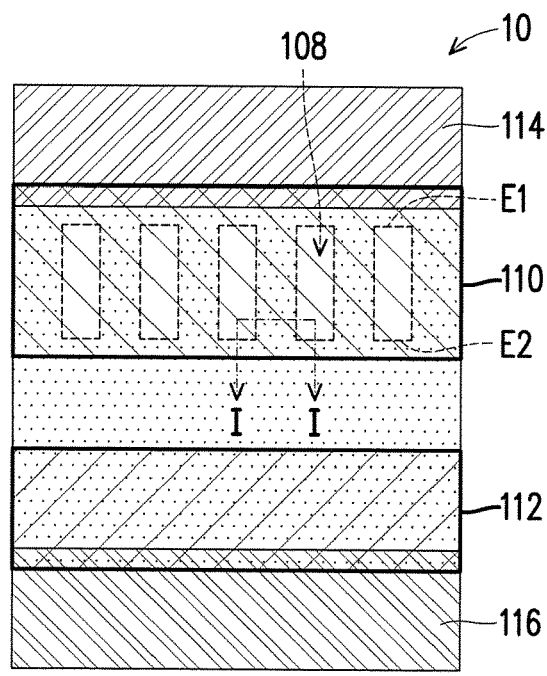
FIG. 1 to FIG. 9 are schematic top views illustrating various types of hetero-junction Schottky diode devices according to some embodiment of the invention.
Figure 2:
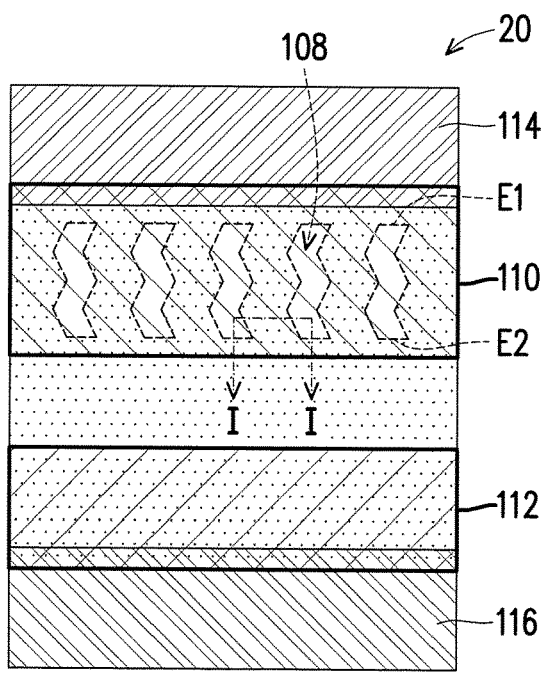
Figure 3:
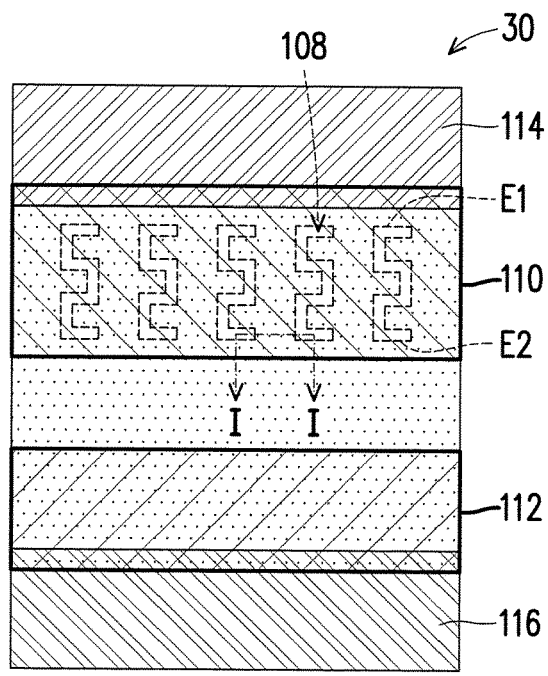
Figure 4:
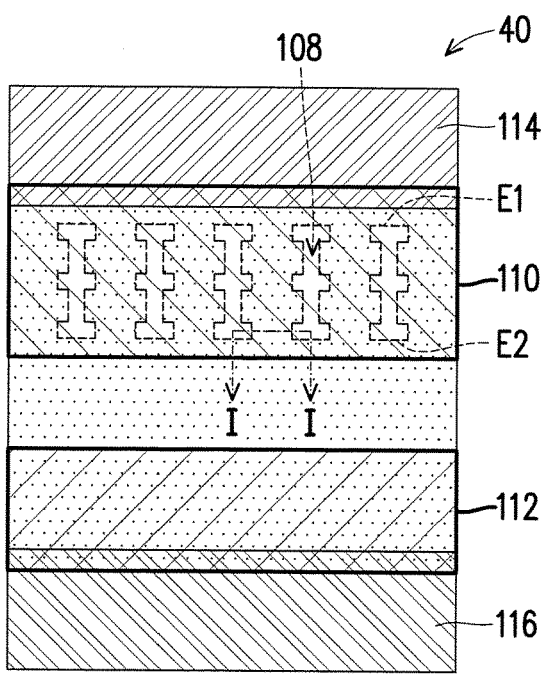

In addition, viewing from the top view, the strip openings 108 may be in a linear shape in FIG. 1, a saw-tooth shape in FIG. 2, a wave-like shape in FIG. 3 or a fish-bone shape in FIG. 4. The invention provides no limitation to the shape of the strip openings 108. The linear-shaped strip openings 108 in FIG. 6 to FIG. 8 may be designed to have a non-linear shape so as to further increase the contact area between the Schottky metal layer 110 and the 2DEG 105.

The ohmic metal layer 112 is disposed on the barrier layer and spaced apart from the Schottky metal layer 110 by a distance. In some embodiments, an extending direction of the ohmic metal layer 112 is the same as the extending direction of the Schottky metal layer 110. In one embodiment, the material of the ohmic metal layer 112 includes (for example, but not limited to) aluminum titanium alloy or other material that can form ohmic contact with III-V group compound semiconductor. In some embodiments, the ohmic metal layer 112 is not in contact with the strip openings 108 as shown in FIG. 1 to FIG. 4 and FIG. 8. In other embodiments, the ohmic metal layer 112 is disposed across the strip openings 108 and fills in the strip openings 108 as shown in FIG. 5 to FIG. 7.

In some embodiments, each of the strip openings 108 is disposed under the Schottky metal layer 110, and both end portions E1 and E2 thereof are unaligned with an edge of the Schottky metal layer 110 as shown in FIG. 1 to FIG. 4 and FIG. 8. In another embodiment, each of the strip openings 108 is disposed under the Schottky metal layer 110 and the ohmic metal layer 112, and one end portion E1 thereof is aligned with the edge of the Schottky metal layer 110, and the other end portion E2 thereof is aligned with the edge of the ohmic metal layer 112 as shown in FIG. 5. In yet another embodiment, each of the strip openings 108 is disposed under the Schottky metal layer 110 and the ohmic metal layer 112, and one end portion E1 thereof is unaligned with the edge of the Schottky metal layer 110, and the other end portion E2 thereof is aligned with the edge of the ohmic metal layer 112 as shown in FIG. 6. In another embodiment, each of the strip openings 108 is disposed under the Schottky metal layer 110 and the ohmic metal layer 112, and one end portion E1 thereof is aligned with the edge of the Schottky metal layer 110, and the other end portion E2 thereof is unaligned with the edge of the ohmic metal layer 112 as shown in FIG. 7. In still another embodiment, each of the strip openings 108 is disposed under the Schottky metal layer 110 and the ohmic metal layer 112, and the both end portions E1 and E2 thereof extend beyond the Schottky metal layer 110 and the ohmic metal layer 112 without being aligned with the edge of the Schottky metal layer 110 or the ohmic metal layer 112 as shown in FIG. 9.

Figure 5:
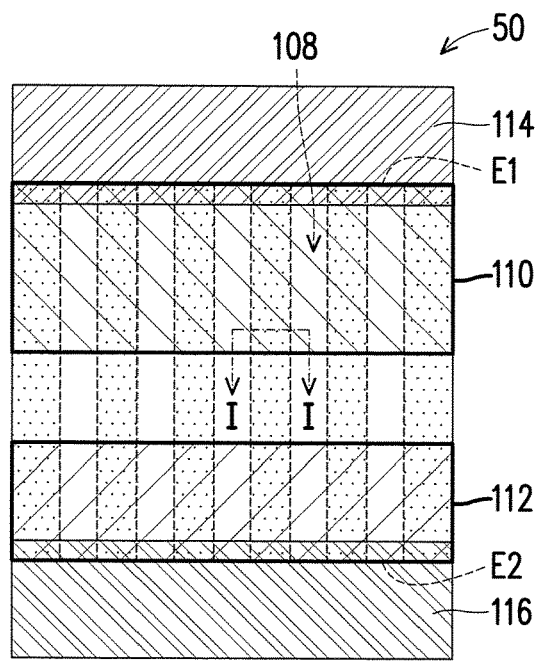

From another perspective, in the structure illustrated in FIG. 5 and FIG. 9, the channel layer 104 and the barrier layer disposed thereon may form a plurality of three-dimensional structures such as a fin, a pillar or other concave-convex structure. The three-dimensional structure is disposed on the buffer layer 102, and the three-dimensional structure and the strip openings 108 are disposed alternately.

Further referring to FIG. 1 to FIG. 8, the hetero-junction Schottky diode devices 10/20/30/40/50/60/70/80/90 of the invention further include an anode metal layer 114 and a cathode metal layer 116. The anode metal layer 114 and the cathode metal layer 116 are disposed on both sides of the Schottky metal layer 110. More specifically, the anode metal layer 114 and the cathode metal layer 116 are disposed on an external side of the Schottky metal layer 110 and the ohmic metal layer 112. The anode metal layer 114 is electrically connected to the Schottky metal layer 110, and the cathode metal layer 116 is electrically connected to the ohmic metal layer 112. In some embodiments, an extending direction of the anode metal layer 114 and the cathode metal layer 116 is the same as the extending direction of the Schottky metal layer 110 as shown in FIG. 1 to FIG. 7. In other embodiment, the extending direction of the anode metal layer 114 and the cathode metal layer 116 is different from the extending direction of the Schottky metal layer 110 as shown in FIG. 8 to FIG. 9.

In the hetero-junction Schottky diode device of the invention, apart from disposing the strip openings, a recess may be disposed between the strip openings so as to increase the contact area between the Schottky metal layer and the 2DEG. Detailed descriptions are incorporated below.

Figure 12:
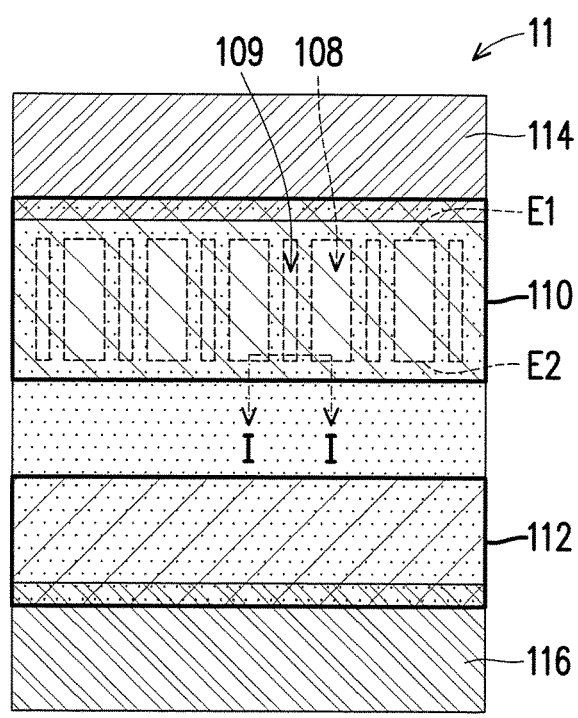
FIG. 12 is a schematic top view illustrating various types of hetero-junction Schottky diode devices according to one embodiment of the invention.
Figure 13:
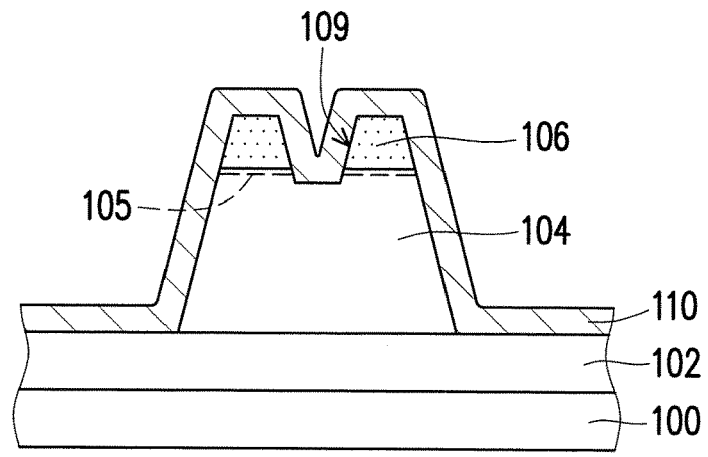
FIG. 13 is a cross-sectional view of FIG. 12 taken along line I-I.
Figure 14:
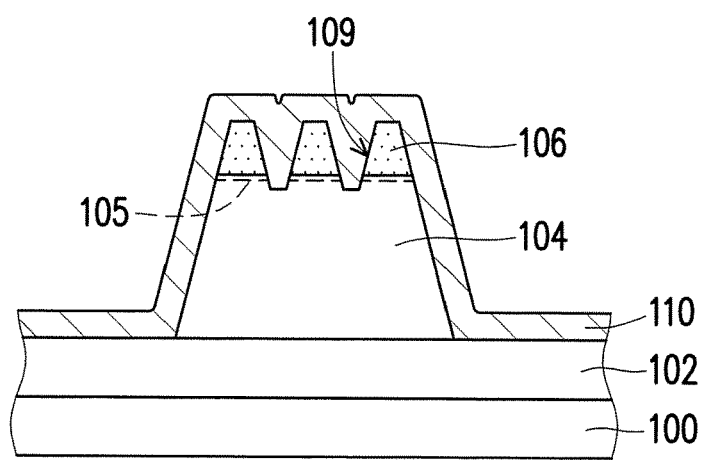
FIG. 14 is a cross-sectional view illustrating various types of hetero-junction Schottky diode devices according to another embodiment of the invention.

FIG. 12 is a schematic top view illustrating various types of hetero-junction Schottky diode devices according to one embodiment of the invention. FIG. 13 is a cross-sectional view of FIG. 12 taken along line I-I. FIG. 14 is a cross-sectional view illustrating various types of hetero-junction Schottky diode devices according to another embodiment of the invention.

A hetero junction Schottky diode device 11 in FIG. 12 is similar to the hetero junction Schottky diode device 10 in FIG. 1. The difference therebetween is that, in the hetero-junction Schottky diode device 11, a plurality of recesses 109 is disposed to penetrate through the barrier layer and extends into a portion of the channel layer 104. A hetero junction Schottky diode device in FIG. 14 is similar to the hetero junction Schottky diode device in FIG. 13, and the difference is a plurality of recesses 109 disposed between two adjacent strip openings 108 in the hetero-junction Schottky diode device of FIG. 14, whereas there is only one single recess 109 between two adjacent strip openings 108 in the hetero-junction Schottky diode device of FIG. 13. The invention provides no limitation to the number of recesses.

In the invention, the bottom portion of the single or plurality of recesses 109 is lower than the 2DEG 105, and the Schottky metal layer 110 fills in the one or plurality of recesses 109. In this manner, the contact area between the Schottky metal layer 110 and 2DEG 105 can be increased so as to reduce transmission resistance and threshold voltage.

In one embodiment, the recess 109 has an inclined sidewall which can further increase the contact area between the Schottky metal layer 110 and the 2DEG 105 as shown in FIG. 13 and FIG. 14. More specifically, an included angle between the sidewall and the bottom surface of the recess 109 is larger than 90 degrees and smaller than 150 degrees, but the invention is not limited thereto. In another embodiment, the recess 109 has a substantially vertical sidewall. In one embodiment, the sidewall of the recess 109 is substantially smooth as shown in FIG. 13 and FIG. 14. In another embodiment, the sidewall of the recess 109 is rough, which can further increase the contact area between the Schottky metal layer 110 and 2DEG 105.

Figure 15:
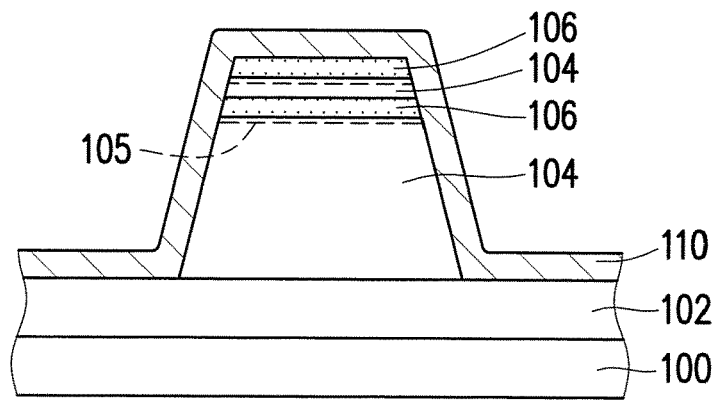
FIG. 15 to FIG. 17 are cross-sectional views illustrating various types of hetero-junction Schottky diode devices according to some embodiments of the invention.
Figure 16:
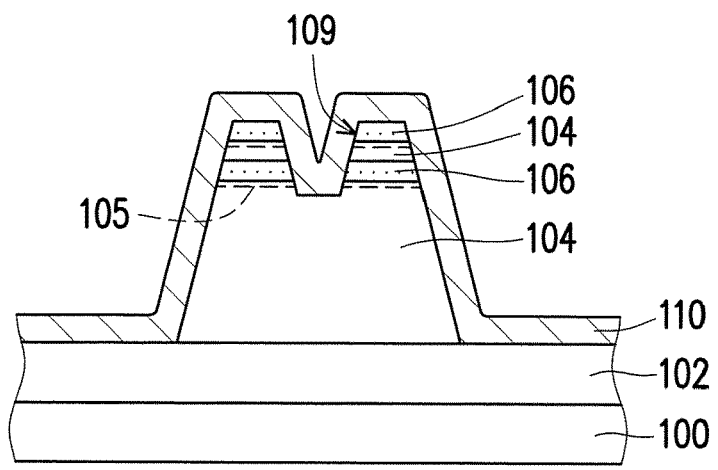
Figure 17:
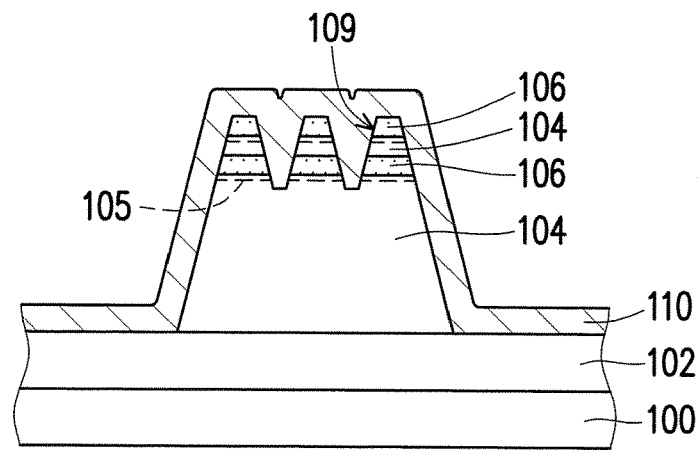

In the above-mentioned embodiments, the hetero-junction Schottky diode device is exemplified as having a single-layered channel layer and a single-layered barrier layer, but the invention is not limited thereto. In another embodiment, the hetero-junction Schottky diode device has a plurality of channel layers 104 and a plurality of barrier layers 106 disposed alternately as shown in FIG. 15 to FIG. 17. Hetero-junction Schottky diode devices in FIG. 15, FIG. 16 and FIG. 17 are similar to the hetero-junction Schottky diode devices in FIG. 10, FIG. 13 and FIG. 14; the difference is that the number of the channel layer is different from the number of the barrier layer. The invention provides no limitation to the numbers of the channel layer and the barrier layer. The hetero-junction Schottky diode devices in FIG. 15, FIG. 16 and FIG. 17 have more 2DEG 105 so that the contact area between the Schottky metal layer 110 and the 2DEG 105 can be further increased.

In the hetero junction Schottky diode device of the invention, apart from disposing the strip openings and/or recess, a silicon-containing layer may be doped in the barrier layer so as to reduce the energy barrier of the metal and 2DEG. Detailed descriptions in this regard are incorporated below.

Figure 18:
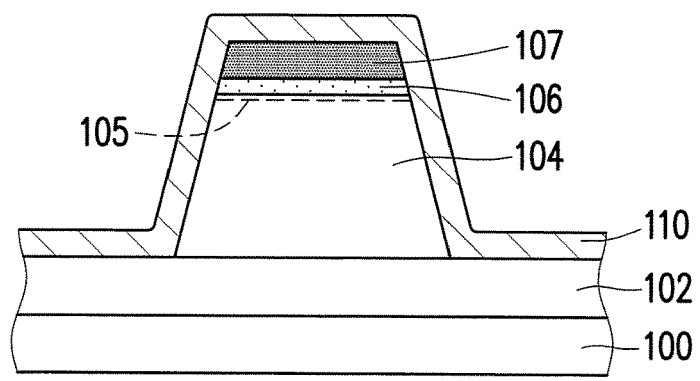
FIG. 18 is a cross-sectional view illustrating various types of hetero-junction Schottky diode devices according to one embodiment of the invention.

FIG. 18 is a cross-sectional view illustrating various types of hetero-junction Schottky diode devices according to one embodiment of the invention.

A hetero-junction Schottky diode device in FIG. 18 is similar to the hetero-junction Schottky diode device in FIG. 10; the difference is that the hetero-junction Schottky diode device in FIG. 18 further includes a silicon-containing doped layer 107. The silicon-containing doped layer 107 is disposed in the barrier layer 106 and brought into contact with the Schottky metal layer 110. In one embodiment, the doped concentration of the silicon-containing doped layer 107 is about $5 \times 10^{14}$ to about $5 \times 10^{19}$ atom/cm$^3$, for example, about $5 \times 10^{15}$ to about $5 \times 10^{18}$ atom/cm$^3$ or about $5 \times 10^{16}$ to about $5 \times 10^{17}$ atom/cm$^3$. A bottom surface of the silicon-containing doped layer 107 is higher than a boundary between the barrier layer 106 and the channel layer 104. In one embodiment, counting from the surface of the barrier layer 106, a depth of the silicon-containing doped layer 107 accounts for about ½ to about ¾ of the depth of the channel layer 104, for example, about ⅔. Such silicon-containing doped layer 107 can reduce the contact resistance between the Schottky metal layer 110 and the 2DEG 105.

According to an embodiment, the present disclosure further provides a hetero junction Schottky diode device including: a buffer layer disposed on a substrate; at least one channel layer disposed on the buffer layer; at least one barrier layer disposed on the at least one channel layer; and a Schottky metal layer disposed on the at least one barrier layer, across the strip openings and filling in the strip openings, and indirect contact with the at least one channel layer. A plurality of strip openings is disposed to penetrate through the at least one barrier layer and the at last one channel layer.

In summary, as compared with conventional planar Schottky diode device, the hetero junction Schottky diode device of the invention is a three-dimensional structure which can increase the contact area between the Schottky metal layer and the 2DEG so as to reduce transmission resistance and threshold voltage. In addition, the structure of the invention not only can increase effective current absorbing area but also can be easily integrated at a wafer level as a significantly competitive Schottky diode device.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A hetero-junction Schottky diode device, comprising:
   a buffer layer, disposed on a substrate;
   at least one channel layer, disposed on the buffer layer;
   at least one barrier layer, disposed on the at least one channel layer, wherein a plurality of strip openings is disposed to penetrate through the at least one barrier layer and the at last one channel layer; and
   a Schottky metal layer, disposed on the at least one barrier layer, across the strip openings and filling in the strip openings.

2. The hetero-junction Schottky diode device according to claim 1, wherein the strip openings extend along a first direction, and the Schottky metal layer extends along a second direction, and the second direction is different from the first direction.

3. The hetero junction Schottky diode device according to claim 1, wherein an end portion of the strip openings is unaligned with an edge of the Schottky metal layer.

4. The hetero-junction Schottky diode device according to claim 1, wherein an end portion of the strip openings is aligned with an edge of the Schottky metal layer.

5. The hetero junction Schottky diode device according to claim 1, further comprising an ohmic metal layer, disposed on the barrier layer and spaced apart from the Schottky metal layer by a distance.

6. The hetero junction Schottky diode device according to claim 5, wherein the strip openings extend along a first direction, the ohmic metal layer extends along a second direction, and the second direction is different from the first direction.

7. The hetero junction Schottky diode device according to claim 5, wherein the ohmic metal layer is not in contact with the strip-openings.

8. The hetero-junction Schottky diode device according to claim 5, wherein the ohmic metal layer is disposed across the strip openings and fills in the strip openings.

9. The hetero-junction Schottky diode device according to claim 1, wherein each of the strip openings has an inclined sidewall.

10. The hetero junction Schottky diode device according to claim 1, wherein the strip openings are in a linear-shape, a saw-tooth shape, a wave-like shape or a fish-bone shape.

11. The hetero-junction Schottky diode device according to claim 1, wherein a sidewall of the strip openings is substantially smooth.

12. The hetero-junction Schottky diode device according to claim 1, wherein a sidewall of the strip openings is rough.

13. The hetero-junction Schottky diode device according to claim 1, wherein at least one recess is disposed to penetrate through the at least one barrier layer and extends into a portion of the at least one channel layer, and the at least one recess is disposed between two of the adjacent strip openings.

14. The hetero-junction Schottky diode device according to claim 13, wherein a bottom portion of the at least one recess is lower than a two-dimensional electronic gas (2DEG), and the Schottky metal layer fills in the at least one recess.

15. The hetero junction Schottky diode device according to claim 1, wherein the at least one channel layer comprises a plurality of channel layers, the at least one barrier layer comprises a plurality of barrier layers, and the plurality of channel layers and the plurality of barrier layers are disposed alternately.

16. The hetero junction Schottky diode device according to claim 1, further comprising an anode metal layer and a cathode metal layer, disposed on both sides of the Schottky metal layer, and an extending direction of the anode metal layer and the cathode metal layer is the same as an extending direction of the Schottky metal layer.

17. The hetero-junction Schottky diode device according to claim 1, further comprising an anode metal layer and a cathode metal layer, disposed on both sides of the Schottky metal layer, and an extending direction of the anode metal layer and the cathode metal layer is different from an extending direction of the Schottky metal layer.

18. A hetero junction Schottky diode device, comprising:
   a buffer layer disposed on a substrate;
   at least one channel layer disposed on the buffer layer;
   at least one barrier layer disposed on the at least one channel layer, wherein a plurality of strip openings is disposed to penetrate through the at least one barrier layer and the at last one channel layer; and
   a Schottky metal layer disposed on the at least one barrier layer, across the strip openings and filling in the strip openings, and indirect contact with the at least one channel layer.

* * * * *